United States Patent
Haraguchi et al.

(10) Patent No.: US 6,465,796 B1
(45) Date of Patent: Oct. 15, 2002

(54) CHARGE-PARTICLE BEAM LITHOGRAPHY SYSTEM OF BLANKING APERTURE ARRAY TYPE

(75) Inventors: Takeshi Haraguchi; Tomohiko Abe; Yoshihisa Ooae, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/350,238

(22) Filed: Jul. 9, 1999

(30) Foreign Application Priority Data

Jul. 10, 1998 (JP) .......................................... 10-195579

(51) Int. Cl.[7] .............................................. H01J 37/304
(52) U.S. Cl. ............................. 250/492.23; 250/492.22; 250/505.1
(58) Field of Search ....................... 250/492.23, 492.22, 250/505.1, 492.2

(56) References Cited

U.S. PATENT DOCUMENTS

| | | | |
|---|---|---|---|
| 4,899,060 A | | 2/1990 | Lischke .................... 250/505.1 |
| 4,982,099 A | | 1/1991 | Lischke .................... 250/492.2 |
| 5,223,719 A | * | 6/1993 | Takahashi et al. ........ 250/492.2 |
| 5,256,579 A | | 10/1993 | Lezec et al. .................. 437/22 |
| 5,260,579 A | | 11/1993 | Yasuda et al. ............ 250/492.2 |
| 5,557,110 A | | 9/1996 | Itoh ........................ 250/492.23 |
| 5,650,631 A | | 7/1997 | Sobda et al. ............. 250/492.2 |
| 5,912,469 A | * | 6/1999 | Okino .................... 250/492.23 |
| 6,034,376 A | * | 3/2000 | Ema ....................... 250/492.23 |
| 6,121,625 A | * | 9/2000 | Ito et al. ................. 250/492.22 |
| 6,222,197 B1 | * | 4/2001 | Kojima ................... 250/492.22 |
| 6,232,612 B1 | * | 5/2001 | Nakajima ............... 250/492.23 |

FOREIGN PATENT DOCUMENTS

JP          7-302574          11/1995

\* cited by examiner

*Primary Examiner*—Kiet T. Nguyen
(74) *Attorney, Agent, or Firm*—Christie, Parker & Hale, LLP

(57) ABSTRACT

Disclosed is a charged-particle beam lithography system in which deterioration of a BAA chip is prevented without a reduction in the magnitude of a charged-particle beam used for exposure. The charged-particle beam lithography system has a charged-particle beam emitter source and a chip having a plurality of apertures arrayed therein. The plurality of apertures shapes a charged-particle beam emitted from the emitter source so that the cross section thereof will have a predetermined shape. The charged-particle beam lithography system uses the charged-particle beam having passed through the apertures to pattern an exposed sample. The charged-particle beam lithography system includes a mask having a plurality of apertures bored therein. The plurality of apertures is arrayed in the same manner as the plurality of apertures arrayed in the chip, and has a size that is any multiple of the size of the apertures of the chip. The mask is located on a path, along which the charged-particle beam travels, between the charged-particle beam emitter source and chip.

8 Claims, 3 Drawing Sheets

CHARGE-PARTICLE BEAM LITHOGRAPHY SYSTEM OF BLANKING APERTURE ARRAY TYPE

BACKGROUND OF THE INVENTION

1. Field of the Invention

The present invention relates to a lithography system employing a charged-particle beam such as an electron beam. More particularly, this invention is concerned with a technology useful in preventing deterioration of a chip having apertures set in an array in an electron-beam lithography system adopting a blanking aperture array (BAA) lithography method. The apertures are used to pattern an exposed sample (specifically, a wafer).

2. Description of the Related Art

Charged-particle beam lithography systems employing a charged-particle beam such as an electron beam are attracting attention as high-resolution lithography systems superior to photolithography systems. Compared with a photolithography system, the charged-particle beam lithography system has the advantage of being able to draw a high-resolution pattern. However, the charged-particle beam lithography system has the drawback of low throughput. Various methods such as a block lithography method and the BAA method have been proposed in efforts to improve throughput. The present invention relates to a BAA type charged-particle beam lithography system. A BAA type electron-beam lithography system has been disclosed in U.S. Pat. No. 5,256,579 or the like.

According to the BAA method, a BAA chip or a chip having numerous fine apertures arrayed therein is positioned on the path of a charged-particle beam. The charged-particle beam is thus split into numerous fine beams. The BAA chip has deflecting electrodes formed on the surface thereof in association with the apertures. When no voltage is applied to the electrodes, the fine beams passing through the apertures are irradiated as they are. When a voltage is applied to the electrodes, the fine beams passing through the apertures are deflected and intercepted. Thus, the on and off states of the fine beams passing through the apertures can be controlled individually. The numerous beams delivered by the BAA chip are swept undirectionally over a sample. Fine beams to be used to expose part of the sample are turned on or transmitted. Consequently, one point on the sample is exposed many times. High exposure energy can therefore be exerted. Moreover, the rate of an increase or decrease in the number of fine beams to be turned on or off becomes moderate. This brings about the advantage that a focal point can be adjusted readily finely.

In a BAA type charged-particle beam lithography system, a charged-particle beam emitted from a charged-particle source is irradiated directly to a BAA chip. This poses a problem in which an unopened part of the BAA chip is thermally damaged. To be more specific, since the beam is kept irradiated to the unopened part, the part is locally heated or impurities adhere to the part. Consequently, the pattern of apertures of the BAA chip deforms. Moreover, melting of the BAA chip, or especially, melting of deflecting electrodes may occur. Eventually, the BAA chip deteriorates and the service life thereof is shortened.

For overcoming the above drawbacks, for example, an accelerating voltage can be, conceivably, limited in order to reduce the magnitude of a current (the magnitude of a charged-particle beam) to be supplied. The accelerating voltage is applied to the cathode and anode of a charged-particle beam source. The intensity of the beam irradiated finally to a wafer is lowered accordingly. This poses another problem in that, since the irradiation time per one shot must be extended in order to draw a pattern on the wafer, throughput decreases.

Moreover, it is conceivable that the lithography system is used with the magnitude of a current reduced. However, if the use is extended over a prolonged period of time, the unopened part of the BAA chip would be thermally damaged. Eventually, a technique in which the magnitude of a current is reduced cannot be said to prove effective.

SUMMARY OF THE INVENTION

An object of the present invention is to provide a charged-particle beam lithography system capable of preventing deterioration of a BAA chip without a reduction in the magnitude of a charged-particle beam used for exposure. The charged-particle beam lithography system can eventually contribute to maintenance of high-precision exposure and to extension of the service life of the BAA chip.

For overcoming the foregoing drawbacks of the related art, according to the present invention, a mask having apertures and matched with a BAA chip is placed in front of the BAA chip. The magnitude of a charged-particle beam to be irradiated to the unopened part of the BAA chip is thus reduced.

To be more specific, according to the present invention, there is provided a charged-particle beam lithography system including a charged-particle beam emitter source, and a chip having a plurality of apertures arrayed therein. The plurality of apertures shapes a charged-particle beam emitted from the emitter source so that the cross section of the charged-particle beam will assume a predetermined shape. The charged-particle beam lithography system uses the charged-particle beam having passed through the apertures to pattern an exposed sample. The charged-particle beam lithography system further includes a mask having a plurality of apertures bored therein. The plurality of apertures is arrayed in the same manner as the plurality of apertures arrayed in the chip, and has a size that is any multiple of the size of the apertures. The mask is positioned on a path, along which the charged-particle beam travels, between the charged-particle beam emitter source and chip.

According to the configuration of the charged-particle beam lithography system of the present invention, the mask is positioned on the path, along which the charged-particle beam travels, between the charged-particle beam emitter source and chip (BAA chip). The mask has the plurality of apertures bored therein. The plurality of apertures is arrayed in the same manner as the plurality of apertures bored in the BAA chip and has a size that is any multiple of the size of the apertures. The charged-particle beam emanating from the emitter source is irradiated to the mask. Portions of the irradiated beam that have passed through the apertures of the mask are irradiated to the corresponding apertures of the BAA chip. A majority of the irradiated beam passes through the apertures and then travels downstream. Owing to the intervention of the mask, the magnitude of a beam irradiated to an unopened part of the BAA chip can be reduced without a reduction in the magnitude of the charged-particle beam emitted from the emitter source and used for exposure.

Consequently, thermal damage caused by a beam irradiated onto the unopened part of the BAA chip can be alleviated drastically. In other words, the unopened part is not heated locally and impurities do not adhere to the unopened part. Consequently, deformation of the pattern of apertures in the BAA chip can be prevented. Moreover, the drawback that the BAA chip melts can be overcome. This leads to suppression of deterioration of the BAA chip, and eventually contributes to maintenance of high-precision exposure and extension of the service life of the BAA chip.

Moreover, in the charged-particle beam lithography system, the apertures bored in the mask may have the same shape as the apertures bored in the BAA chip and also have the same size. In this case, beams transmitted by the apertures of the mask can be passed through the corresponding apertures of the BAA chip as they are. Namely, the magnitude of a beam irradiated to the unopened part of the BAA chip can be reduced further. The aforesaid advantage of the present invention will be exerted more effectively.

In the charged-particle beam lithography system, the mask may be held on a stage that is movable in the horizontal directions. For exerting the aforesaid advantage of the present invention, the mask and BAA chip are preferably positioned so that the apertures of the mask and those of the BAA chip will align with each other. However, in practice, it is very hard to accurately align the apertures of the mask with those of the BAA chip. In this case, the stage is moved in the horizontal directions. Thus, the apertures of the mask and BAA chip can be aligned with each other readily. Consequently, the advantage of the present invention can be exerted more effectively.

Moreover, in the charged-particle beam lithography system, an electronic lens may be interposed between the mask and chip. The electronic lens forms an image of the pattern of apertures represented by a charged-particle beam, which has passed through the apertures of the mask, on the chip according to the size of the apertures of the mask that is a multiple of the size of those of the chip. For exerting the aforesaid advantage of the present invention effectively, the image of the pattern of apertures represented by a charged-particle beam, which has passed through the apertures of the mask, should preferably be formed on the chip, or more particularly, on the apertures of the chip. In this case, the electronic lens is used to accurately form the image of the pattern of apertures on the chip according to the size of the apertures of the mask that is a multiple of the size of those of the chip. Thus, the aforesaid advantage of the present invention is exerted more effectively.

Furthermore, in the aforesaid charged-particle beam lithography system, an alignment coil may be interposed between the mask and chip. The alignment coil is used to align the image of the pattern of apertures with the apertures of the chip. It is easy to align the apertures of the mask with the apertures of the BAA chip by moving the stage properly in horizontal directions. The precision in alignment is not always satisfactory. In this case, the precision in alignment can be improved by employing the alignment coil. Thus, the aforesaid advantage of the present invention can be exerted much more effectively.

BRIEF DESCRIPTION OF THE DRAWINGS

The present invention will be more clearly understood from the description as set below with reference to the accompanying drawings, wherein.

DESCRIPTION OF THE PREFERRED EMBODIMENT

Before proceeding to a detailed description of the preferred embodiments, a conventional BAA type electron-beam lithography system will be described with reference to the accompanying drawings relating thereto to allow clearer understanding of the differences between the conventional art and the present invention.

A description will be made by taking a BAA type electron-beam lithography system for instance. The present invention can be implemented in any BAA type charged-particle beam lithography system.

Figure 1:
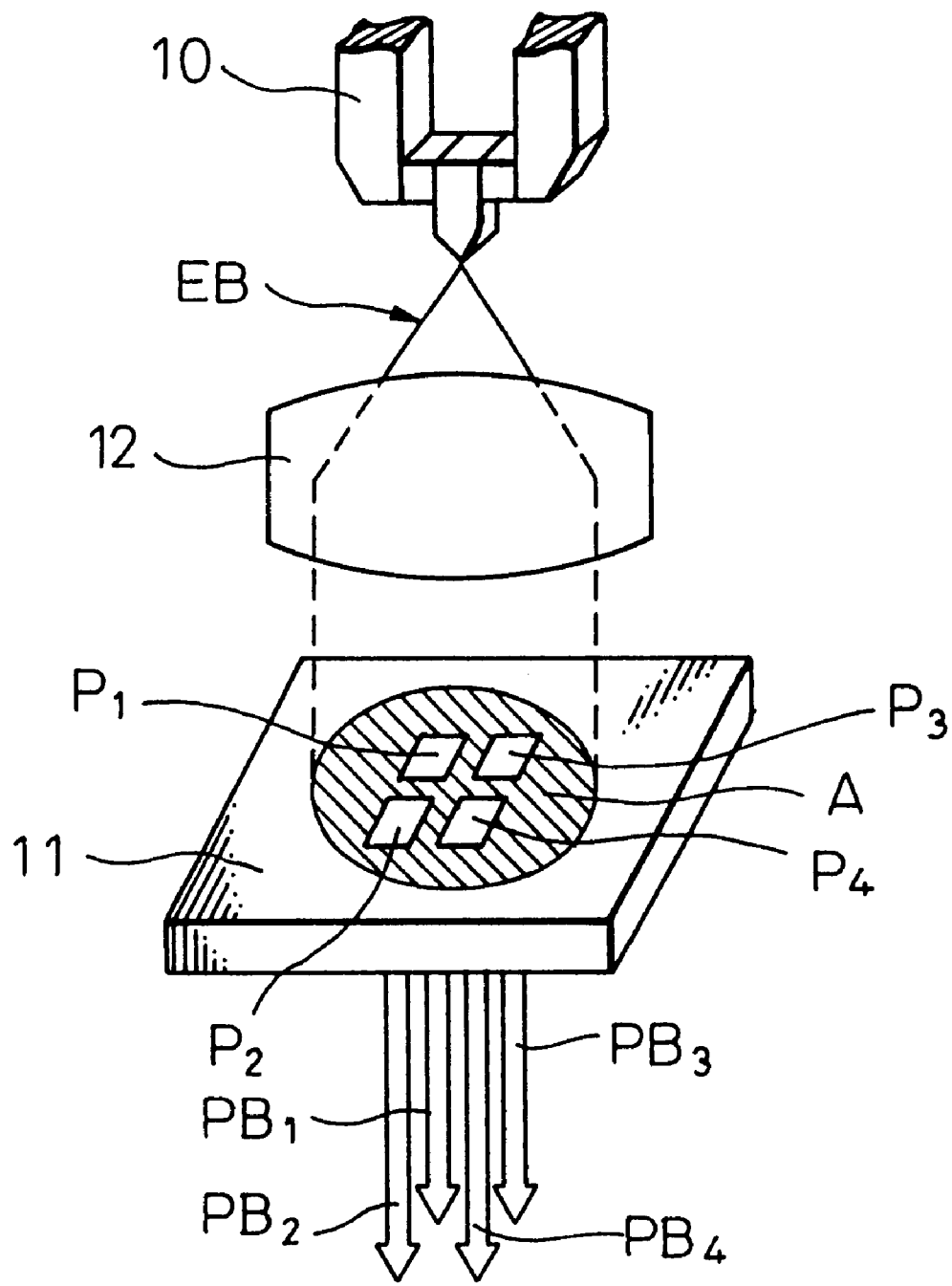
FIG. 1 is an oblique view schematically showing the configuration of an exposure unit included in an electron-beam lithography system of a BAA lithography type in accordance with a related art.

FIG. 1 schematically shows the configuration of an exposure unit included in an electron-beam lithography system of a BAA lithography type in accordance with a related art. In the drawing, there are shown an electron gun 10, a BAA chip 11, and a beam converging/deflecting and deflection correcting means 12. The electron gun 10 emits an electron beam used for exposure. The BAA chip 11 has a plurality of apertures (four apertures P1 to P4 in the drawing) arrayed for shaping an incident electron beam so that the cross section thereof will be rectangular. The beam converging/deflecting and deflection correcting means (electronic lens, deflector, beam deflection correcting coil, etc.) is interposed between the electron gun 10 and a BAA chip 11. The beam converging/deflecting and deflection correcting means converges and deflects an electron beam EB emitted from the electron gun 10, and corrects deflection thereof.

In the foregoing configuration, the electron beam EB emitted from the electron gun 10 is converged and deflected by the beam converging/deflecting and deflection correcting means 12, and has deflection thereof corrected thereby. The electron beam EB is then irradiated onto the BAA chip 11. A hatched part A in the drawing indicates an area on the BAA chip 11 to which the electron beam is irradiated. The electron beam irradiated to the BAA chip 11 passes through the apertures P1 to P4, whereby beams PB1 to PB4 having a rectangular cross section are transmitted downstream. The components arrayed downstream of the BAA chip 11 are identical to those of an ordinary BAA type lithography system that is generally known by a person with ordinary skill in the art. The components will therefore not be illustrated in particular. For example, the on and off states (transmission and interception) of the beams PB1 to PB4 having transmitted by the apertures P1 to P4 of the BAA chip 11 are controlled by a blanking deflector. The cross sections of the beams are reduced in size by a reduction lens. After the beams are reshaped to a predetermined shape by an aperture stop, the beams are irradiated to a wafer through a projection lens. At this time, a main deflector and sub deflector are used to position the beams on the wafer. Consequently, a pattern represented by the irradiated beams is drawn on the wafer (the wafer is exposed). Thus, the wafer is patterned using the beams PB1 to PB4 transmitted by the apertures P1 to P4 of the BAA chip 11.

As mentioned above, in the configuration of the conventional BAA type lithography system, the electron beam EB emitted from the electron gun 10 is irradiated directly to the BAA chip 11 via the beam converging/deflecting and deflection correcting means 12. This poses a problem in that the unopened part (hatched part A) of the BAA chip 11 is thermally damaged. Specifically, since the beam is kept irradiated to the unopened part, the part is locally heated or impurities adhere to the part. Consequently, the pattern of apertures of the BAA chip 11 (apertures P1 to P4) is deformed. Moreover, in some cases, the BAA chip 11 may be melted. This poses a problem in that the BAA chip 11 deteriorates and the service life of the BAA chip is shortened. If the shape of the pattern of apertures of the BAA chip 11 changes, the shape of the pattern to be drawn finally on a wafer changes accordingly. This invites degradation of exposure precision.

The problems underlying the BAA type lithography system employing an electron beam have been described. The same applies to a lithography system employing, for example, an ion beam.

Figure 2:
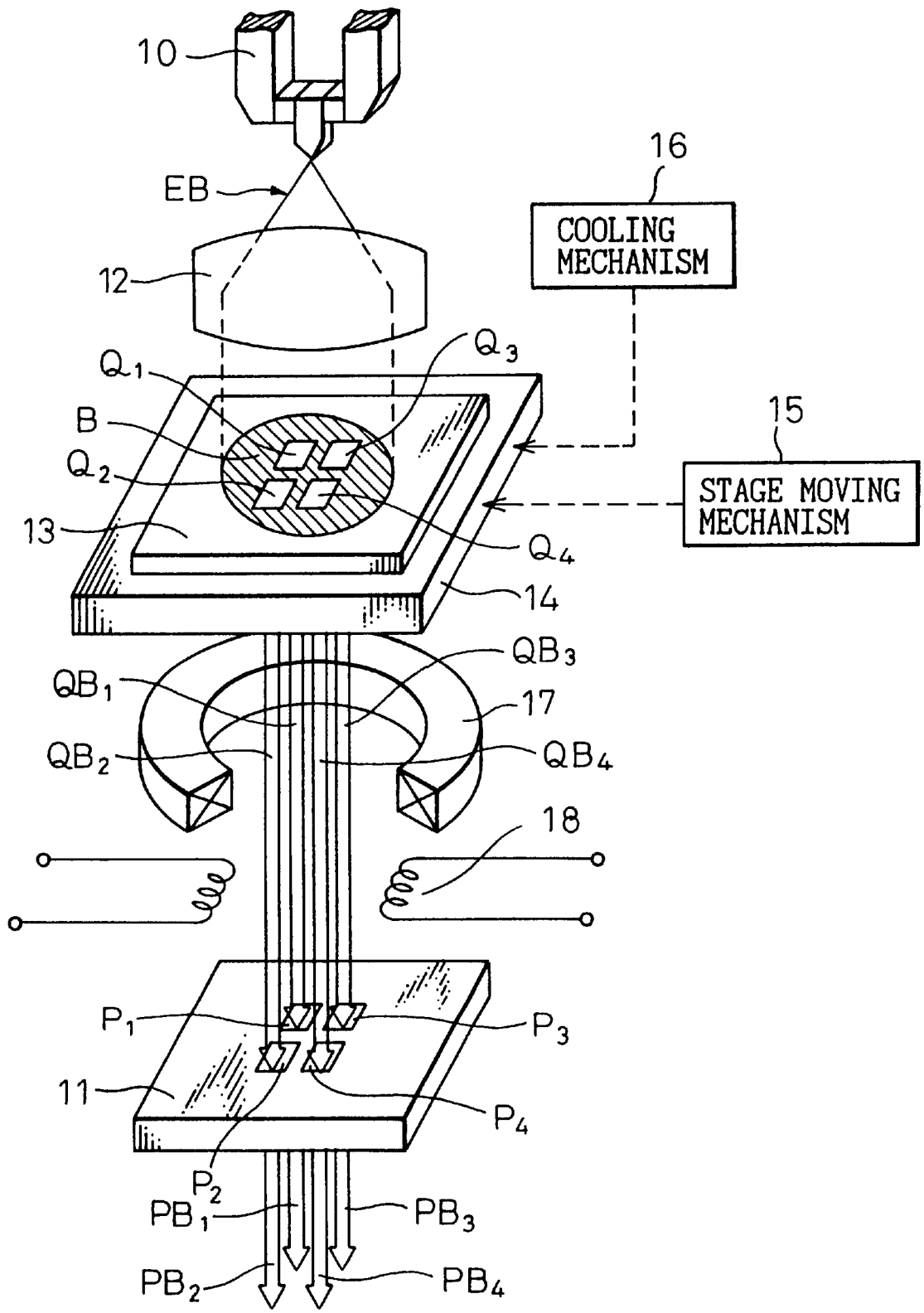
FIG. 2 is an oblique view schematically showing the configuration of an exposure unit included in an electron-beam lithography system of the BAA lithography type in accordance with an embodiment of the present invention.

FIG. 2 schematically shows the configuration of an exposure unit included in an electron-beam lithography system of a BAA lithography type in accordance with an embodiment of the present invention.

In FIG. 2, the same reference numerals as those shown in FIG. 1 denote the identical components. The description of the components will be omitted.

The features of the configuration of the electron-beam lithography system in accordance with the embodiment are identical to those of the configuration shown in FIG. 1. The other features thereof will be described below. Namely, (1) a mask 13 is located on a path, along which the electron beam EB travels, between the beam converging/deflecting and deflection correcting means 12 and BAA chip 11. (2) A stage 14 on which the mask 13 is mounted is included to be movable in horizontal directions. Namely, the stage is movable in one direction, a direction orthogonal to the direction, and a direction of rotation on a plane perpendicular to a direction in which the electron beam EB travels. (3) A stage moving mechanism 15 is included for moving the stage 14. (4) A cooling mechanism 16 employing a coolant is included for cooling the stage. (5) An electronic lens 17 is interposed between the stage 14 having the mask 13 mounted thereon and the BAA chip 11. (6) An alignment coil 18 is interposed between the electronic lens 17 and BAA chip 11.

The mask 13 has a plurality of apertures (four apertures Q1 to Q4 in the drawing) bored therein. The apertures Q1 to Q4 are arrayed in the same manner as the apertures P1 to P4 of the BAA chip 11. The apertures Q1 to Q4 have the same shape (rectangular shape in the drawing) as the apertures P1 to P4 and the same size as them. For example, assume that the apertures P1 to P4 of the BAA chip 11 have the size of 10 $\mu$m by 10 $\mu$m. In this case, the apertures Q1 to Q4 of the mask 13 have the same size of 10 $\mu$m by 10 $\mu$m. Moreover, the mask 13 and BAA chip 11 are made of silicon.

In the foregoing configuration, the electron beam EB emitted from the electron gun 10 is converged and deflected by the beam converging/deflecting and deflection correcting means 12, and has deflection thereof corrected thereby. Thereafter, the electron beam EB is irradiated to the mask 13. A hatched part B in the drawing indicates an area on the mask 13 to which the electron beam is irradiated. An electron beam irradiated to the mask 13 has the cross section thereof shaped rectangularly while passing through the apertures Q1 to Q4. Beams QB1 to QB4 are transmitted downstream and irradiated onto the BAA chip 11.

The beams QB1 to QB4 transmitted by the apertures Q1 to Q4 of the mask 13 are irradiated onto the BAA chip 11. At this time, the stage 14 is, if necessary, moved properly in horizontal directions by the stage moving mechanism 15. Thus, the apertures Q1 to Q4 of the mask 13 are aligned with the apertures P1 to P4 of the BAA chip 11. Moreover, an image of the pattern of apertures represented by the beams QB1 to QB4 transmitted by the apertures Q1 to Q4 of the mask 13 is formed on the BAA chip 11 by the electronic lens 17. The image of the pattern of apertures is aligned with the apertures P1 to P4 of the BAA chip 11. The beams QB1 to QB4 transmitted by the apertures Q1 to Q4 of the mask 13 can therefore substantially pass through the corresponding apertures P1 to P4 of the BAA chip 11.

The beams PB1 to PB4 transmitted by the apertures P1 to P4 of the BAA chip 11 are optically processed and finally irradiated to a wafer as described in conjunction with FIG. 1. The beams are positioned on the wafer by the main deflector and sub deflector. Thereafter, the wafer is patterned accordingly.

According to the configuration of the electron-beam lithography system of this embodiment, the apertures Q1 to Q4 of the mask 13 are arrayed in the same manner as the apertures P1 to P4 of the BAA chip 11. The apertures Q1 to Q4 have the same shape and size as the apertures P1 to P4 thereof. The mask 13 having the apertures Q1 to Q4 is located upstream of the BAA chip 11. It can therefore be prevented that the electron beam EB emanating from the electron gun 10 is irradiated directly to the BAA chip 11. Moreover, the beams QB1 to QB4 transmitted by the apertures Q1 to Q4 of the mask 13 can be passed through the corresponding apertures P1 to P4 of the BAA chip 11 as they are. Owing to the intervention of the mask 13, the magnitude of a beam to be irradiated to the unopened part of the BAA chip 11 can be reduced drastically (reduced to become substantially nil in this embodiment). At this time, the reduction in the magnitude of the beam will not be accompanied by any reduction in the magnitude of a current to be emitted from the electron gun 10 (the electron beam EB).

Consequently, thermal damage of the unopened part of the BAA chip 11 caused by a beam can be substantially eliminated. Deformation of the pattern of apertures of the BAA chip 11 can be prevented. Besides, the drawback of melting can be overcome. This facilitates prevention of deterioration of the BAA chip 11 and contributes to maintenance of high-precision exposure and extension of the service life of the BAA chip.

Moreover, the cooling mechanism 16 is included for cooling the stage 14 having the mask 13 mounted thereon. Consequently, thermal damage can be alleviated. The thermal damage occurs when the electron beam EB emanating from the electron gun 10 is kept irradiated directly onto the unopened part (hatched part B) of the mask 13 via the beam converging/deflecting and deflection correcting means 12. This eventually contributes to extension of the service life of the mask 13.

Furthermore, the apertures Q1 to Q4 of the mask 13 have the same shape and size as the apertures P1 to P4 of the BAA chip 11. Moreover, the mask 13 is made of the same material (silicon) as the BAA chip 11. The mask 13 can therefore be partly manufactured at the same step of a manufacturing process as the BAA chip 11. This facilitates simplification of the manufacturing process.

Moreover, the mask 13 may be made of a metallic material such as molybdenum (Mo) or platinum (Pt) instead of silicon. This provides the merit that the mask 13 can be produced through machining.

In the aforesaid embodiment, the apertures Q1 to Q4 of the mask 13 have the same rectangular shape as the apertures P1 to P4 of the BAA chip 11. The shape of the former need not always be the same as that of the latter. For example, the apertures of the mask may have a circular or triangular shape, or any other shape. Even in this case, the same advantage as that of the aforesaid embodiment can be exerted. The extent to which the advantage is exerted may be unequal, though.

Figure 3:
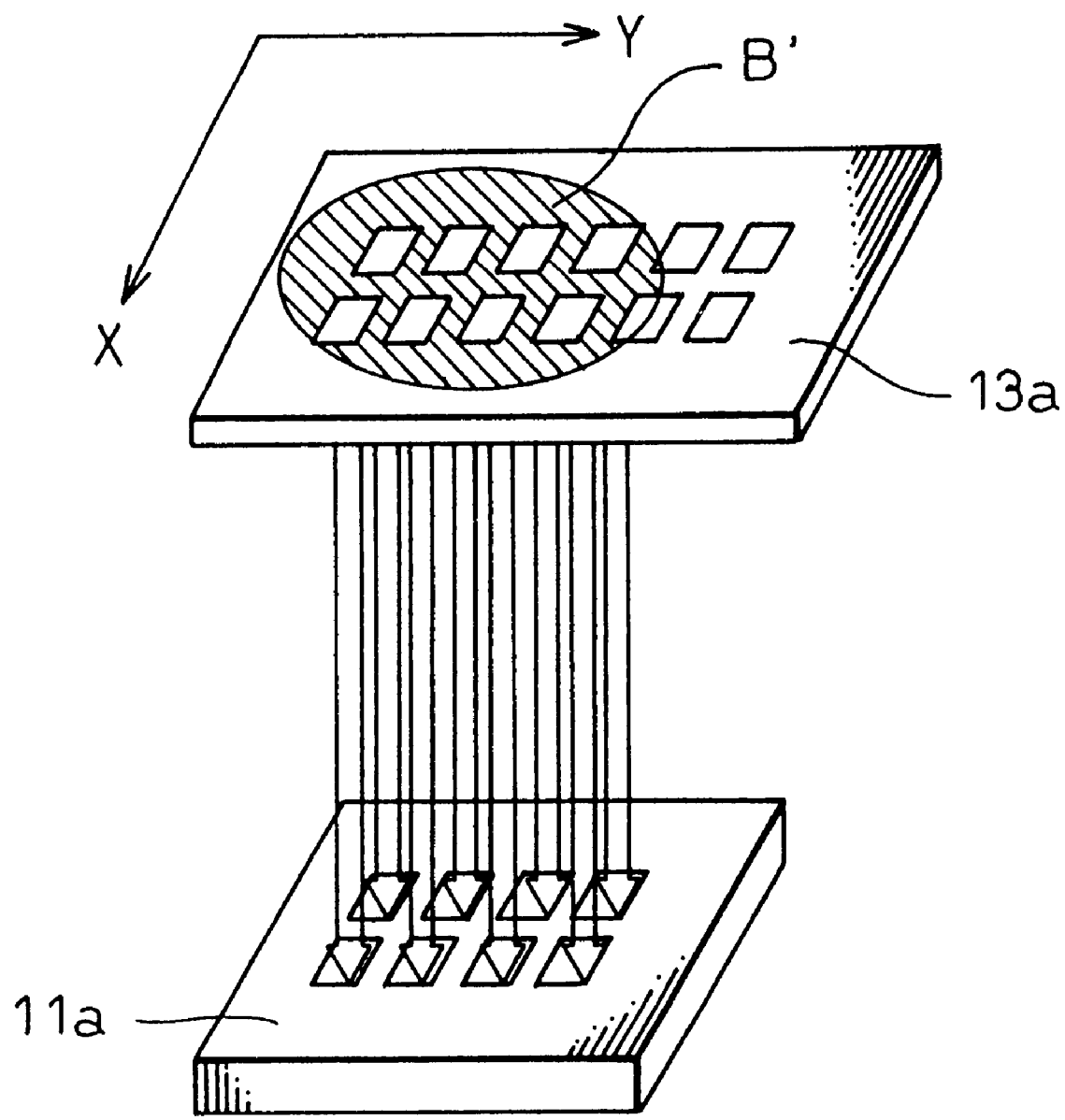
FIG. 3 is an explanatory diagram concerning a variant of the embodiment shown in FIG. 2.

Moreover, in the aforesaid embodiment, the number of apertures Q1 to Q4 of the mask 13 is the same as the number of apertures P1 to P4 of the BAA chip 11. The number of apertures to be bored in the mask 13 need not always be identical to the number of apertures bored in the BAA chip 11. The former should merely be larger than the latter. FIG. 3 shows an example.

FIG. 3 schematically shows a variant having the BAA chip 11 and mask 13 modified (including a BAA chip 11a and mask 13a). Herein, the other components (electron gun 10, beam converging/deflecting and deflection correcting means 12, stage 14, stage moving mechanism 15, cooling mechanism 16, electron lens 17, and alignment coil 18) are not illustrated for brevity. A hatched part B' indicates an area on the mask 13a to which an electron beam is irradiated.

As shown in FIG. 3, the BAA chip 11a has two apertures arrayed in the X direction and four columns of two apertures (eight apertures) arrayed in the Y direction with an equal pitch between adjoining columns. By contrast, the mask 13a has eight apertures corresponding to the apertures of the BAA chip 11a. The mask 13a has two additional columns of apertures (four apertures) arrayed in the Y direction with an equal pitch between adjoining columns).

Even in this variant, similarly to the embodiment shown in FIG. 2, the stage 14 having the mask 13a mounted thereon is moved horizontally. Thus, the apertures of the mask 13a are aligned with those of the BAA chip 11a. However, the precision in alignment is not always satisfactory enough. The mask 13a is therefore, as illustrated, provided with extra apertures (four apertures). This provides the merit that a positional deviation driving from horizontal movements of the mask 13a (in the Y direction in the drawing) can be tolerated by a length equivalent to two columns of apertures.

The embodiment and variant have been described on the assumption that an electron beam is used as a charged-particle beam. As apparent from the gist of the present invention, the present invention will not be limited to any specific kind of beam as long as the beam is a charged-particle beam. For example, an ion beam can be employed.

As described so far, according to the present invention, there is provided a charged-particle beam lithography system in which a mask having specific apertures is located on a path, along which a charged-particle beam travels, between a charged-particle beam emitter source and a BAA chip. Consequently, deterioration of the BAA chip can be prevented without a reduction in the magnitude of a charged-particle beam used for exposure. Eventually, high-precision exposure can be maintained and the service life of the BAA chip can be extended.

What is claimed is:

1. A Blanking Aperture Array (BAA) charged-particle beam lithography system comprising a charged-particle beam emitter source;

a BAA chip having a plurality of apertures arrayed therein for shaping a charged-particle beam emitted from said emitter source so that the cross section thereof will assume a predetermined shape, and patterning an exposed sample using the charged-particle beam having passed through said apertures; and a mask having a plurality of apertures, which is arrayed to match said plurality of apertures arrayed in said BAA chip and having a size that is any multiple of the size of said apertures of said BAA chip, bored therein, wherein said mask is located on a path, along which the charged-particle beam travels, between said charged-particle beam emitter source and said BAA chip.

2. A Blanking Aperture Array (BAA) charged-particle beam lithography system according to claim 1, wherein said apertures bored in said mask have the same shape and size as said apertures bored in said BAA chip.

3. A Blanking Aperture Array (BAA) charged-particle beam lithography system according to claim 1, wherein said mask is held on a stage movable in horizontal directions.

4. A Blanking Aperture Array (BAA) charged-particle beam lithography system according to claim 3, wherein an electronic lens for forming an image of the pattern of apertures represented by the charged-particle beam having passed through said apertures of said mask on said BAA chip according to the size of said apertures of said mask that is a multiple of the size of those said BAA chip is interposed between said mask and BAA chip.

5. A Blanking Aperture Array (BAA) charged-particle beam lithography system according to claim 4, wherein an alignment coil for aligning said image of the pattern of apertures with said apertures of said BAA chip is interposed between said mask and BAA chip.

6. A Blanking Aperture Array (BAA) charged-particle beam lithography system according to claim 1, wherein said apertures bored in said mask have the same shape as said apertures bored in said BAA chip.

7. A Blanking Aperture Array (BAA) charged-particle beam lithography system according to claim 1, wherein said apertures bored in said mask have the same size as said apertures bored in said BAA chip.

8. A Blanking Aperture Array (BAA) charged-particle beam lithography system according to claim 1, wherein said apertures bored in said mask are aligned with said apertures bored in said BAA chip.

* * * * *